(12) United States Patent
Kang

(10) Patent No.: US 9,607,670 B2
(45) Date of Patent: Mar. 28, 2017

(54) DATA INPUT CIRCUIT AND SEMICONDUCTOR MEMORY DEVICE INCLUDING THE SAME

(71) Applicant: SK hynix Inc., Gyeonggi-do (KR)

(72) Inventor: Yong Gu Kang, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/971,266

(22) Filed: Dec. 16, 2015

(65) Prior Publication Data

US 2017/0011787 A1  Jan. 12, 2017

(30) Foreign Application Priority Data

Jul. 10, 2015 (KR) .................. 10-2015-0098510

(51) Int. Cl.
*G11C 7/12* (2006.01)
*G11C 7/10* (2006.01)
*G11C 7/22* (2006.01)

(52) U.S. Cl.
CPC .............. *G11C 7/12* (2013.01); *G11C 7/1087* (2013.01); *G11C 7/222* (2013.01)

(58) Field of Classification Search
None
See application file for complete search history.

(56) References Cited

U.S. PATENT DOCUMENTS

| 5,583,457 A * | 12/1996 | Horiguchi ............. G06F 1/3203 326/121 |
| 2008/0080278 A1* | 4/2008 | Shin ..................... G11C 7/1048 365/203 |

FOREIGN PATENT DOCUMENTS

| KR | 1020080001297 | 1/2008 |
| KR | 1020140141091 | 12/2014 |

* cited by examiner

*Primary Examiner* — James G Norman
(74) *Attorney, Agent, or Firm* — IP & T Group LLP

(57) ABSTRACT

A data input circuit may include a data latch unit suitable for latching input data as latch data in response to first and second latch signals; a data signal generation unit suitable for outputting first and second data signals corresponding to the latch data; a first drive unit suitable for pulling up or down a first input/output data line of an input/output data line pair in response to the first and second data signals; and a second drive unit suitable for pulling up or down a second input/output data line of the input/output data line pair in response to the first and second data signals, wherein the first and second drive units adjust pull-up levels of the first and second input/output data lines in response to a data input control signal.

20 Claims, 12 Drawing Sheets

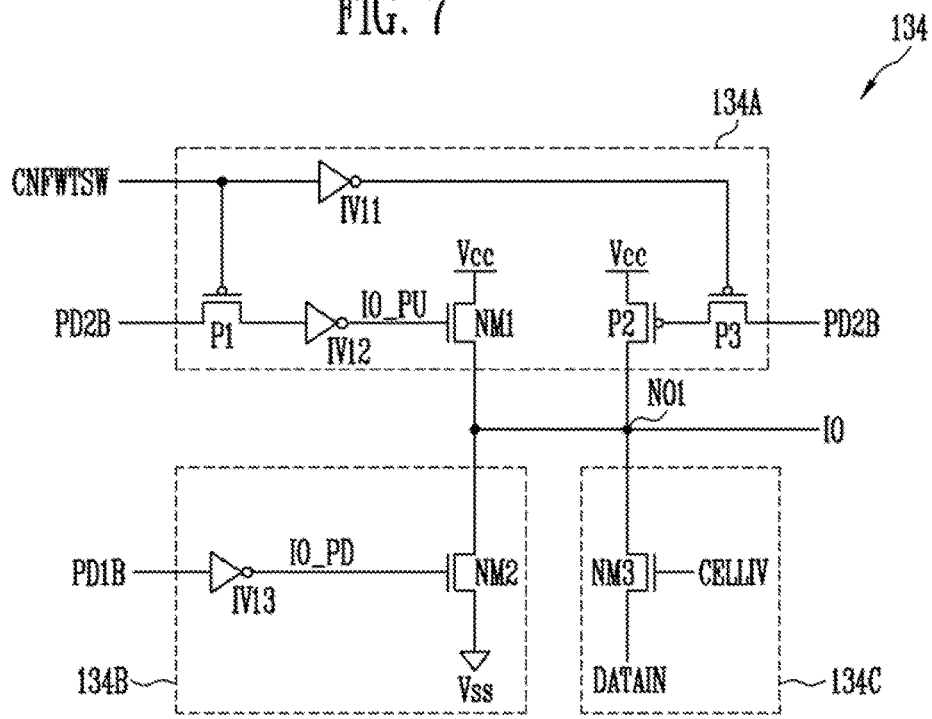
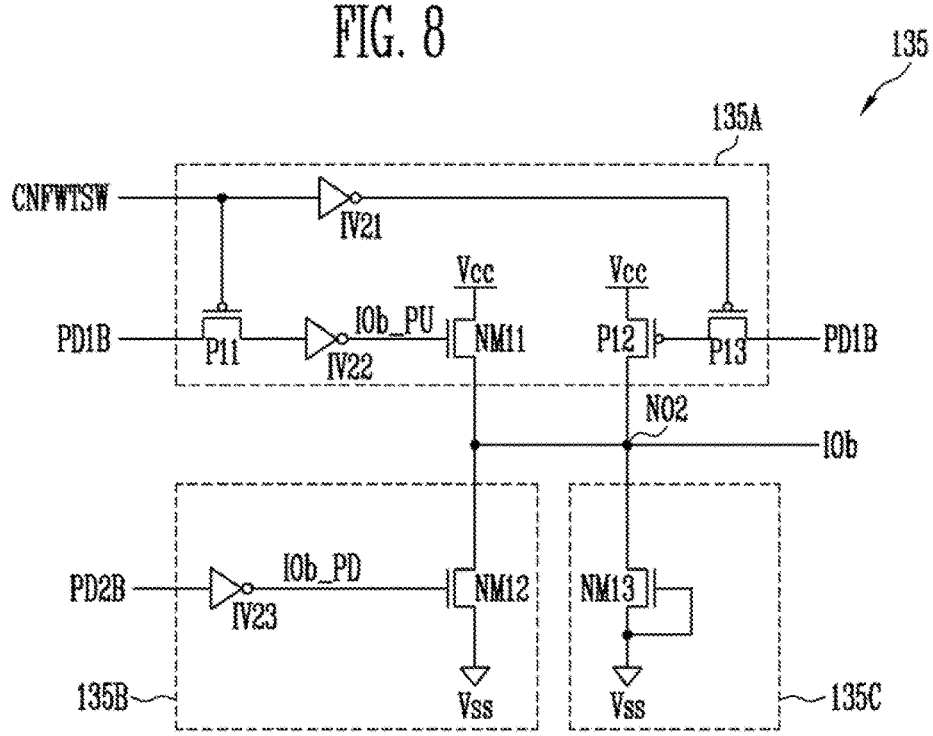

DATA INPUT CIRCUIT AND SEMICONDUCTOR MEMORY DEVICE INCLUDING THE SAME

CROSS-REFERENCE TO RELATED APPLICATION

The present application claims priority to Korean patent Application No. 10-2015-0098510, filed on Jul. 10, 2015, the entire disclosure of which is herein incorporated by reference in its entirety.

BACKGROUND

Field of Invention

Various embodiments of the present disclosure relate to an electronic device, and more particularly, to a data input circuit and a semiconductor memory device including the data input circuit.

Description of the Related Art

Among semiconductor devices, semiconductor memory devices are particularly classified into a volatile memory device and a nonvolatile memory device.

The nonvolatile memory device can retain data stored therein even when power is turned off, although read and write speeds are comparatively low. Therefore, the nonvolatile memory device is used when there is the need for storing data which must be maintained regardless of supply of power. Read only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), Ferroelectric RAM (FRAM), etc. are representative examples of the nonvolatile memory device. Flash memory is classified into NOR type and NAND type.

The flash memory has both advantages of RAM in which data is programmable and erasable and ROM in which data store therein can be retained even when power is interrupted. Such flash memory is widely used as a storage medium of portable electronic devices such as a digital camera, a personal digital assistant (PDA) and MP3.

SUMMARY

Various embodiments of the present disclosure are directed to a data input circuit with reduced current consumption and reduced size, and to a semiconductor memory device including the data input circuit.

One embodiment of the present disclosure may include a data input circuit, including: a data latch unit suitable for latching input data as latch data in response to first and second latch signals; a data signal generation unit suitable for outputting first and second data signals corresponding to the latch data; a first drive unit suitable for pulling up or down a first input/output data line of an input/output data line pair in response to the first and second data signals; and a second drive unit suitable for pulling up or down a second input/output data line of the input/output data line pair in response to the first and second data signals, wherein the first and second drive units adjust pull-up levels of the first and second input/output data lines in response to a data input control signal.

Another embodiment of the present disclosure may include a semiconductor memory device including a memory cell array including a plurality of memory cells; a read and write circuit connected to a plurality of bit lines of the memory cell array, and suitable for controlling potentials of the plurality of bit lines according to data to be programmed; and a data input circuit connected to the rear and write circuit and an input/output data line pair, and suitable for driving the input/output data line pair in response to input data and controlling a pull-up level of the input/output data line pair in response to a data input control signal.

Another embodiment of the present disclosure may include a data input circuit, including: The data input circuit may include: a data latch unit suitable for latching input data as latch data in response to first and second latch signals; a data signal generation unit suitable for outputting first and second data signals corresponding to the latch data; a first drive unit suitable for pulling up or down a first input/output data line of an input/output data line pair in response to the first and second data signals; and a second drive unit suitable for pulling up or down a second input/output data line of the input/output data line pair in response to the first and second data signals, wherein the first and second drive units reduce pull-up levels of the first and second input/output data lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7 is a circuit diagram illustrating a first drive unit of FIG. 3;

FIG. 8 is a circuit diagram illustrating a second drive unit of FIG. 3;

DETAILED DESCRIPTION

Figure 1:
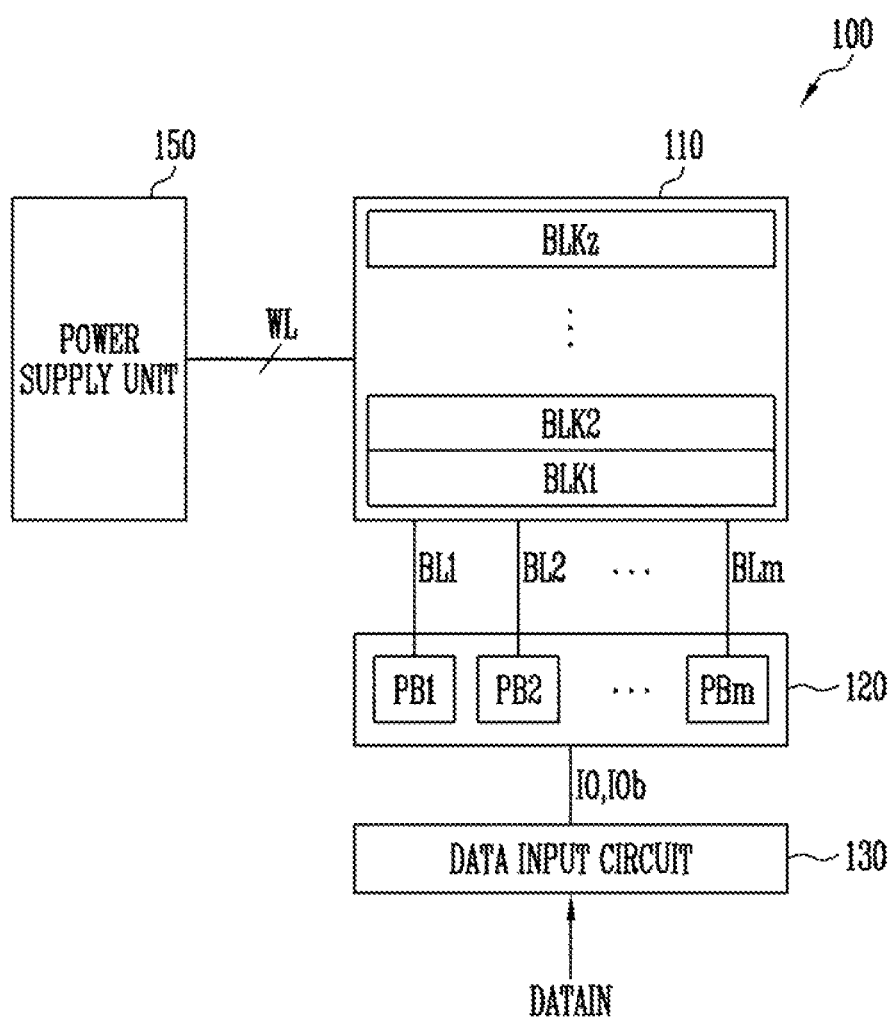
FIG. 1 is a block diagram illustrating a semiconductor memory device according to an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Advantages and features of the present disclosure, and methods for achieving the same will be cleared with reference to exemplary embodiments described later in detail together with the accompanying drawings. Accordingly, the present disclosure is not limited to the following embodiments but embodied in other types. Rather, these embodiments are provided so that the present disclosure will be thorough, and complete, and will fully convey the technical spirit of the disclosure to those skilled in the art.

It will be understood that when an element is referred to as being "coupled" or "connected" to another element, it can be directly coupled or connected to the other element or Intervening elements may be present therebetween. In addition, when an element is referred to as "comprising" or "including" a component, it does not preclude another component but may further include the other component unless the context clearly indicates otherwise.

FIG. 1 is a block diagram illustrating a semiconductor memory device 100 according to an embodiment of the present disclosure.

Referring to FIG. 1, the semiconductor memory device 100 includes a memory cell array 110, a read and write circuit 120, a data input circuit 130, and a voltage supply unit 150.

The memory cell array 110 includes a plurality of memory blocks BLK1 to BLKz. The memory blocks BLK1 to BLKz are connected to the voltage supply unit 150 through word lines WL. The memory blocks BLK1 to BLKz are connected to the read and write circuit 120 through bit lines BL1 to BLm. The bit lines BL1 to BLm may include an even bit line group and an odd bit line group. Each of the memory blocks BLK1 to BLKz includes a plurality of memory cells. In an example, the memory cells are nonvolatile memory cells, and in particular, the memory cells may be charge trap device-based nonvolatile memory cells. Memory cells connected to a single word line among the plurality of memory cells are defined as a single page. In other words, the memory cell array 110 is formed of a plurality of pages. In addition, each of the memory blocks BLK1 to BLKz of the memory cell array 110 includes a plurality of memory strings. Each of the memory strings includes a drain selection transistor cell, which is connected in series between a bit line and a source line, a plurality of memory cells, and a source selection transistor cell.

The read and write circuit 120 includes a plurality of page buffers PB1 to PBm. The page buffers PB1 to PBm are connected to the memory cell array 110 through bit lines BL1 to BLm. Each of the page buffers PB1 to PBm temporarily stores data input from the data input circuit 130 through an input/output data line pair IO and IOb and controls the potential of the corresponding one of the bit lines BL1 to BLm according to the temporarily stored data during the program operation.

The data input circuit 130 receives input data DATAIN, temporarily stores the Input data, and adjusts the potential level of the input/output line pair IO and IOb according to the input data DATAIN for data transmission during the program operation.

The voltage supply unit 150 generates operating voltage to be applied to the word lines WL of the memory cell array 110 during the program operation. For instance, during the program operation, the voltage supply unit 150 generates program voltage and applies the program voltage to selected word lines from among the plurality of word lines, and generates pass voltage and applies the pass voltage to the other non-selected word lines.

Figure 2:
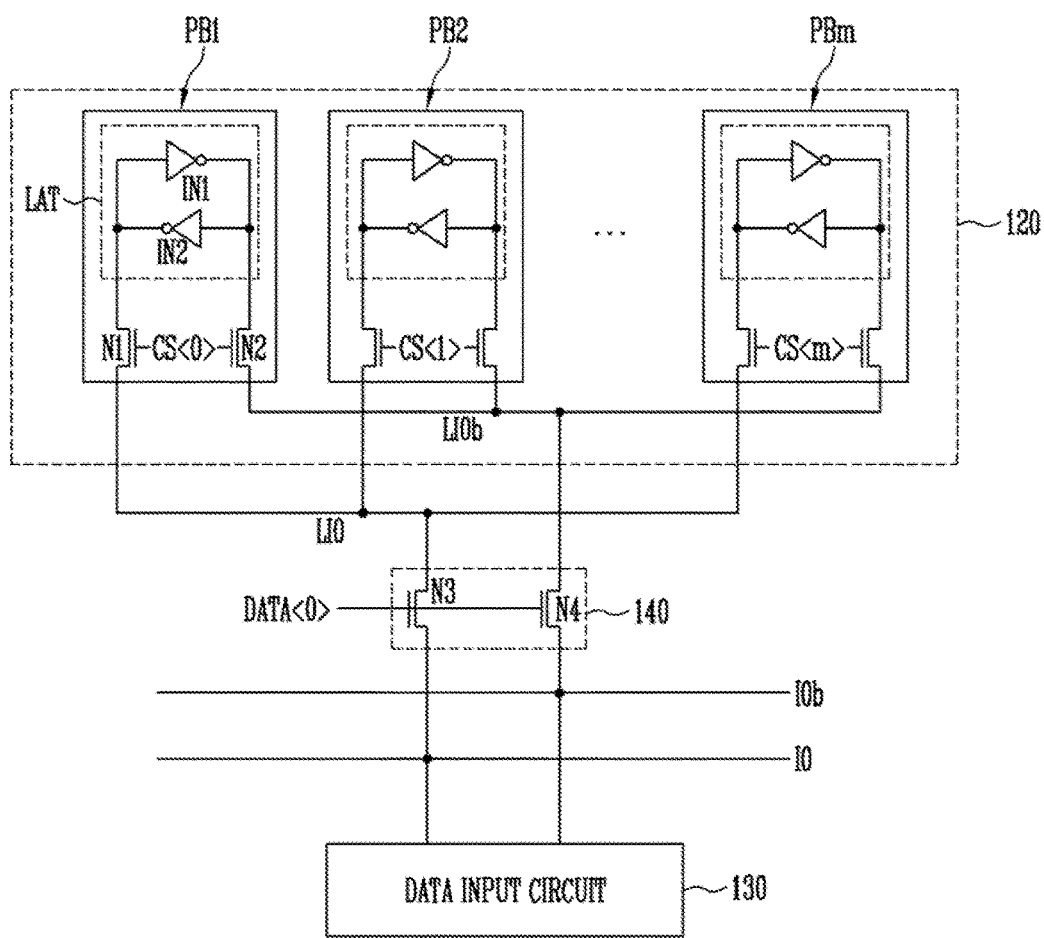
FIG. 2 is a circuit diagram illustrating connection relationship between a read and write circuit and a data input circuit of FIG. 1.

FIG. 2 is a circuit diagram illustrating connection relationship between the read and write circuit 120 and the data input circuit 130.

Referring to FIG. 2, the read and write circuit 120 includes the plurality of page buffers PB1 to PBm. The page buffers PB1 to PBm share a local data line pair LIO and LIOb.

The page buffers PB1 to PBm have a similar structure to each other.

The page buffer PB1 includes a latch LAT for storing program data input thereto, and transistors N1 and N2 which are connected between the latch LAT and the local data line pair LIO and LIOb to send data from the local data line pair LIO and LIOb to the latch LAT in response to a column selection signal CS<0>.

The local data line pair LIO and LIOb is connected to the input/output data line pair 10 and IOb through a data line switching unit 140. The data line switching unit 140 may include a plurality of transistors N3 and N4.

Although the drawing of the present disclosure shows the single local data line pair LIO and LIOb connected to the single input/output data line pair 10 and IOb through the data line switching unit 140, the design of the data line switching unit 140 may be modified in such a way that the single input/output data line pair 10 and IOb corresponds to a plurality of local data line pairs through a plurality of transistors included in the data line switching unit 140.

The data input circuit 130 is connected to the input/output data line pair 10 and IOb.

Figure 3:
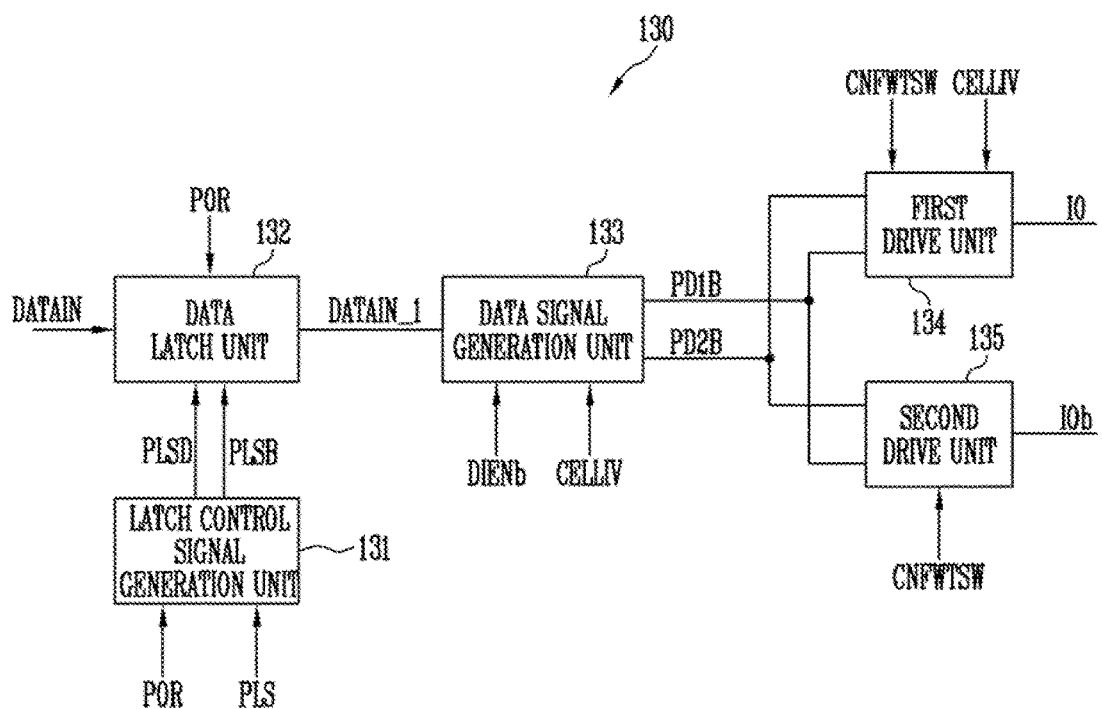
FIG. 3 is a block diagram illustrating the data input circuit of FIG. 1.

FIG. 3 is a block diagram illustrating the data input circuit 130.

Referring to FIG. 3, the data input circuit 130 includes a latch control signal generation unit 131, a data latch unit 132, a data signal generation unit 133, a first drive unit 134, and a second drive unit 135.

The latch control signal generation unit 131 is initialized in response to a power on reset signal POR and generates first and second latch signals PLSD and PLSB in response to a clock signal PLS. The first and second latch signals PLSD and PLSB have opposite phases to each other.

The data latch unit 132 initializes in response to a power on reset signal POR, receives input data DATAIN in response to the first and second latch signals PLSD and PLSB, temporarily stores the input data DATAIN, and outputs the input data DATAIN as latch data DATAIN_1.

The data signal generation unit 133 receives the latch data DATAIN_1 and outputs first and second data signals PD1B and PD2B corresponding to the latch data DATAIN_1 in response to a data input activation signal DIENb. Furthermore, during a cell current measurement operation of the semiconductor memory device, the data signal generation unit 133 outputs the first and second preset data signals PD1B and PD2B in response to a test signal CELLIV.

During a data input operation, the first drive unit 134 pulls up or down a potential level of the first input/output line IO in response to first and second data signals PD1B and PD2B. In addition, the first drive unit 134 may adjust a pull-up potential level of the first input/output line IO in response to a data input control signal CNFWTSW for reduced current consumption. During a cell current measurement operation of the semiconductor memory device, the first drive unit 134 may directly transmit input data to the first input/output line IO in response to a test signal CELLIV.

During a data input operation, the second drive unit 145 pulls up or down a potential level of the second input/output line IOb in response to first and second data signals PD1B and PD2B. In addition, the second drive unit 135 may adjust a pull-up potential level of the second input/output line IOb in response to a data input control signal CNFWTSW for reduced current consumption.

Figure 4:
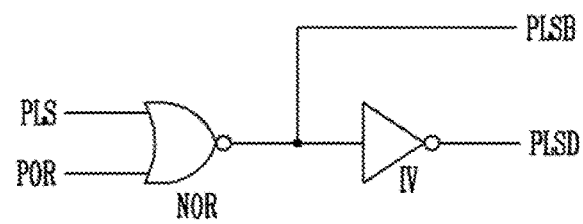
FIG. 4 is a circuit diagram illustrating a latch control signal generation unit of FIG. 3.

FIG. 4 is a circuit diagram illustrating a latch control signal generation unit 131 of FIG. 3.

Referring to FIG. 4, the latch control signal generation unit 131 includes a logic gate NOR and an inverter IV.

The logic gate NOR outputs the second latch signal PLSB in response to the power on reset signal POR and the clock signal PLS. The inverter IV inverts the second latch signal PLSB and outputs the first latch signal PLSD. The first and second latch signals PLSD and PLSB have opposite phases to each other.

Figure 5:
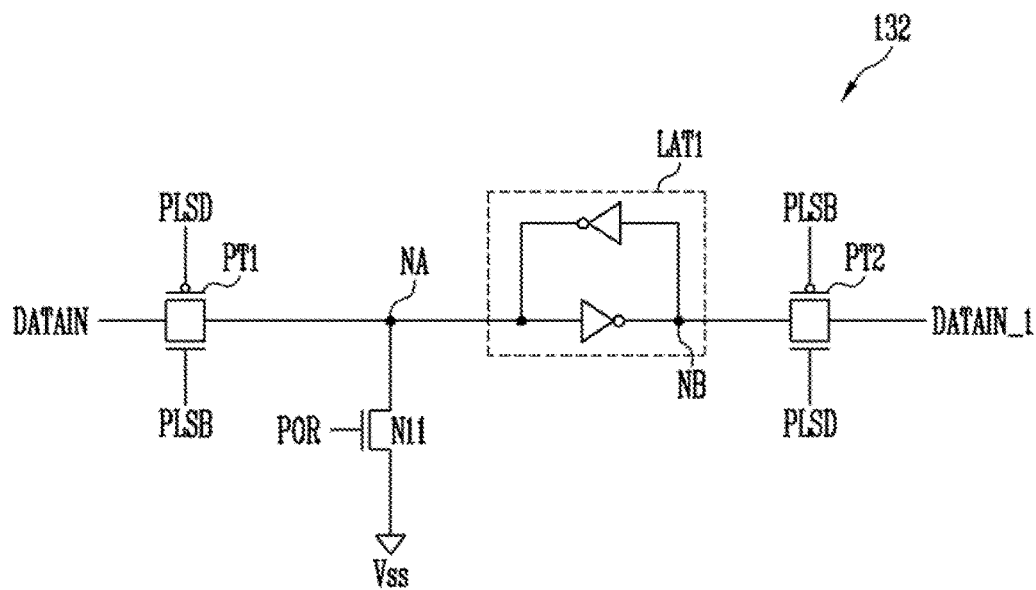
FIG. 5 is a circuit diagram illustrating a data latch unit of FIG. 3.

FIG. 5 is a circuit diagram illustrating the data latch unit 132 of FIG. 3.

Referring to FIG. 5, the data latch unit 132 includes pass transistors PT1 and PT2, a transistor N11, and a latch LAT1.

The pass transistor PT1 transfers the input data DATAIN to an internal node NA in response to the first and second latch signals PLSD and PLSB.

The transistor N11 is connected between the internal node NA and a ground Vss. In response to the power on reset signal POR, the transistor N11 connects the internal node NA and the ground Vss to each other to initialize a potential level of the internal node NA to the voltage of the ground Vss.

The latch LAT1 is connected to the internal node NA and temporarily stores the input data DATAIN transferred from the internal node NA.

In response to the first and second latch signals PLSD and PLSB, the pass transistor PT2 transfers the latched input data DATAIN of the latch LAT1 as latch data DATAIN_1.

Figure 6:
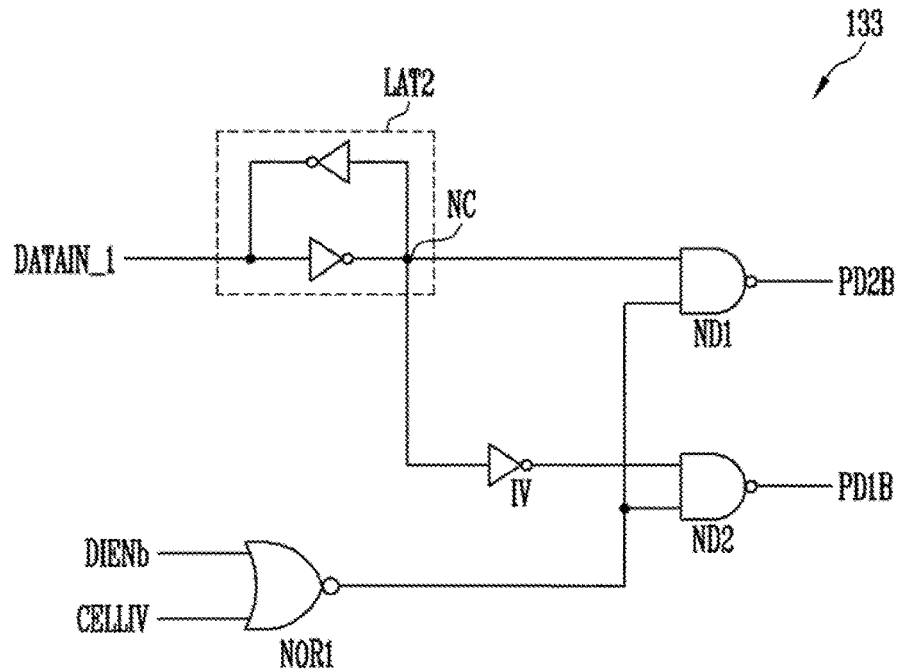
FIG. 6 is a circuit diagram illustrating a data signal generation unit of FIG. 3.

FIG. 6 is a circuit diagram illustrating the data signal generation unit 133 of FIG. 3.

Referring to FIG. 6, the data signal generation unit 133 includes a latch LAT2, an inverter IV, and a plurality of logic gates NOR1, ND1, and ND2.

The latch LAT2 receives the latch data DATAIN_1 output from the data latch unit 132 and temporarily stores the latch data DATAIN_1. The logic gate NOR1 performs a logical operation on the data input activation signal DIENb and the test signal CELLIV and generates a logic signal. The inverter IV is connected to the latch LAT2 at a node NC, and inverts a logic level of the node NC. The logic gate ND1 performs a logical operation on the logic level of the node NC and an output signal of the logic gate NOR1 and thus generates the second data signal PD2B. The logic gate ND2 performs a logical operation on an output signal of the inverter IV and the output signal of the logic gate NOR1 and thus generates the first data signal PD1B. The first data signal PD1B and the second data signal PD2B have opposite phases to each other and alternately toggle between each other.

FIG. 7 is a detail circuit diagram illustrating the first drive unit 134 of FIG. 3.

Referring to FIG. 7, the first drive unit 134 includes a pull-up unit 134A, a pull-down unit 134B, and a test unit 134C.

The pull-up unit 134A includes PMOS transistors P1, P2, and P3, an NMOS transistor NM1, and inverters IV11 and IV12.

The PMOS transistor P1 is turned on in response to the data input control signal CNFWTSW and transfers the second data signal PD2B to the inverter IV12. The inverter IV12 inverts the second data signal PD2B provided from the PMOS transistor P1 and outputs the inverted second data signal PD2B as a pull-up signal IO_PU. The NMOS transistor NM1 is connected between a power supply Vcc and an output node NO1 connected to the first input/output line IO. In response to the pull-up signal IO_PU, the NMOS transistor NM1 increases a potential level of the output node NO1 to a potential level of the voltage of the power supply Vcc minus a threshold voltage Vth of the NMOS transistor NM1.

The inverter IV11 inverts the data input control signal CNFWTSW. The PMOS transistor P3 is turned on in response to a signal output from the inverter IV11, and transfers the second data signal PD2B to a gate of the PMOS transistor P2. The PMOS transistor P2 is connected between the power supply Vcc and the output node NO1. In response to the second data signal PD2B transmitted from the PMOS transistor P3, the PMOS transistor P2 increases the potential level of the output node NO1 to the voltage level of the power supply Vcc.

As described above, the first drive unit 134 pulls up the output node NO1 connected to the first input/output line IO to a high level according to a logic level of the data input control signal CNFWTSW, and selectively drives the NMOS transistor NM1 or the PMOS transistor P2 as a pull-up transistor to adjust the pull-up level of the first input/output line IO thereby reducing current consumption.

The pull-down unit 134B includes an inverter IV13 and a NMOS transistor NM2. The inverter IV13 inverts the first data signal PD1B and thus outputs it as a pull-down signal IO_PD. The NMOS transistor NM2 is connected between the output node NO1 and the ground Vss. In response to the pull-down signal IO_PD, the NMOS transistor NM2 discharges the output node NO1 to a low level.

As described above, the pull-up unit 134A and the pull-down unit 134B of the first drive unit 134 alternately perform pull-up and pull-down operations to the first input/ output line IO in response to the first data signal PD1B and the second data signal PD2B, which have opposite phases and alternately toggle between each other.

The test unit 134C applies the input data DATAIN to the first input/output line IO in response to the test signal CELLIV during the cell current measurement operation. The test unit 134C may include an NMOS transistor NM3. The NMOS transistor NM3 is connected to the first input/output line IO and transmits the input data DATAIN to the first input/output line IO in response to the test signal CELLIV.

FIG. 8 is a circuit diagram illustrating a second drive unit 135 of FIG. 3.

Referring to FIG. 8, the second drive unit 135 includes a pull-up unit 135A, a pull-down unit 135B, and a stabilization unit 135C.

The pull-up unit 135A includes PMOS transistors P11, P12, and P13, an NMOS transistor NM1, and inverters IV11 and IV12.

The PMOS transistor P11 is turned on in response to the data input control signal CNFWTSW and transfers the first data signal PD1B to the inverter IV22. The inverter IV22 inverts the first data signal PD1B provided from the PMOS transistor P11 and outputs the inverted first data signal PD1B as a pull-up signal IOb_PU. The NMOS transistor NM11 is connected between a power supply Vcc and an output node NO2 connected to the second input/output line IOb. In response to the pull-up signal IOb_PU, the NMOS transistor NM11 increases a potential level of the output node NO2 to a potential level of the voltage of the power supply Vcc minus a threshold voltage Vth of the NMOS transistor NM11.

The inverter IV21 inverts the data input control signal CNFWTSW. The PMOS transistor P13 is turned on in response to a signal output from the inverter IV21, and transfers the first data signal PD1B to a gate of the PMOS transistor P12. The PMOS transistor P12 is connected between the power supply Vcc and the output node NO2. In response to the first data signal PD1B transmitted from the PMOS transistor P13, the PMOS transistor P12 increases the potential level of the output node N02 to the voltage level of the power supply Vcc.

As described above, the second drive unit 135 pulls up the output node NO2 connected to the second input/output line IOb to a high level according to the logic level of the data input control signal CNFWTSW, and selectively drives the NMOS transistor NM11 or the PMOS transistor P12 as a pull-up transistor to adjust the pull-up level of the second input/output line IOb thereby reducing current consumption.

The pull-down unit 135B includes an inverter IV23 and a NMOS transistor NM12. The inverter IV23 inverts the second data signal PD2B and thus outputs it as a pull-down signal IOb_PD. The NMOS transistor NM12 is connected between the output node NO2 and the ground Vss. In response to the pull-down signal IOb_PD, the NMOS transistor NM2 discharges the output node N02 to a low level.

The stabilization unit 134C may include an NMOS transistor NM13. The NMOS transistor NM13 is connected between the second input/output line IOb and the ground Vss. A gate of the stabilization unit 134C is connected to the ground Vss.

As described above, the pull-unit 135A and the pull-down unit 135B of the second drive unit 135 alternately perform pull-up and pull-down operations to the second input/output line IOb in response to the first data signal PD1B and the second data signal PD2B, which have opposite phases and alternately toggle between each other.

Figure 9:
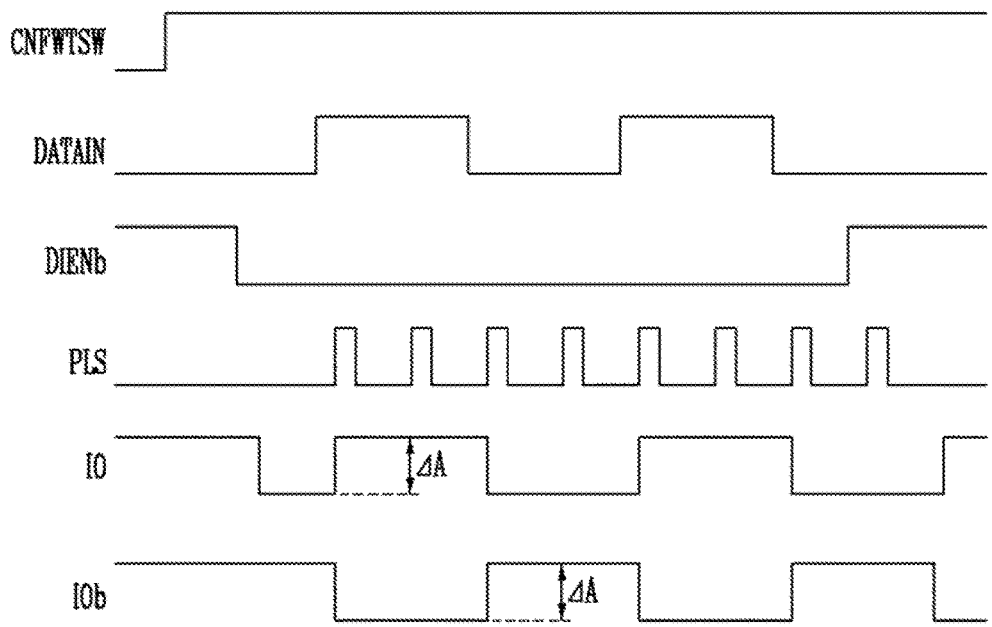
FIG. 9 is a signal waveform diagram illustrating an operation of the data input circuit according to an embodiment of the present disclosure.

FIG. 9 is a signal waveform diagram illustrating an operation of the data input circuit 130 according to an embodiment of the present disclosure.

An example of application of the data input control signal CNFWTSW having a high level to the data input circuit 130 will be described below with reference to FIGS. 3 to 9.

In response to a data input activation signal DIENb, the data signal generation unit 133 is activated.

The latch control signal generation unit 131 generates the first and second latch signals PLSD and PLSB in response to the clock signal PLS having a predetermined period.

The data latch unit 132 temporarily stores the input data DATAIN in response to the first and second latch signals PLSD and PLSB and then outputs it as the latch data DATAIN_1.

The data signal generation unit 133 temporarily stores the latch data DATAIN_1 output from the data latch unit 132. The data signal generation unit 133 outputs first and second data signals PD1B and PD2B according to the latch data DATAIN_1 in response to the data input activation signal DIENb.

The first and second drive units 134 and 135 perform data input operations in such a way as to respectively alternate pull-up and pull-down operations to the first and second input/output lines IO and IOb in response to the first and second data signals PD1B and PD2B.

During the pull-up operation to the first and second input/output lines IO and IOb, the first and second drive units 134 and 135 respectively apply the voltage of the power supply Vcc to the first and second input/output lines IO and IOb through the PMOS transistors P2 and P12 in response to the data input control signals CNFWTSW. Therefore, as shown in FIG. 9, each of the first input/output line IO and the second input/output line IOb have a potential level of ΔA when it is pulled up to a logic high level.

Figure 10:
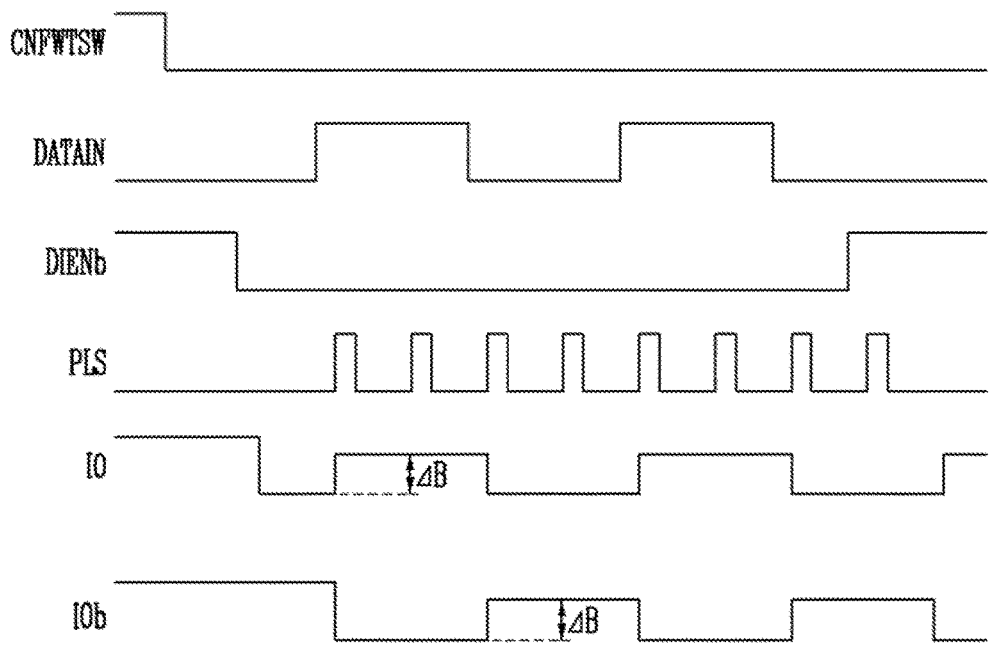
FIG. 10 is a signal waveform diagram illustrating an operation of the data input circuit according to an embodiment of the present disclosure.

FIG. 10 is a signal waveform diagram illustrating an operation of the data input circuit 130 according to an embodiment of the present disclosure.

An example of application of the data input control signal CNFWTSW having a low level to the data input circuit 130 will be described below with reference to FIGS. 3 to 10.

In response to a data input activation signal DIENb, the data signal generation unit 133 is activated.

The latch control signal generation unit 131 generates the first and second latch signals PLSD and PLSB in response to the clock signal PLS having a predetermined period.

The data latch unit 132 temporarily stores the input data DATAIN in response to the first and second latch signals PLSD and PLSB and then outputs it as the latch data DATAIN_1.

The data signal generation unit 133 temporarily stores the latch data DATAIN_1 output from the data latch unit 132. The data signal generation unit 133 outputs first and second data signals PD1B and PD2B according to the latch data DATAIN_1 in response to the data input activation signal DIENb.

The first and second drive units 134 and 135 perform data input operations in such a way as to respectively alternate pull-up and pull-down operations to the first and second input/output lines IO and IOb in response to the first and second data signals PD1B and PD2B.

During the pull-up operation to the first and second input/output lines IO and IOb, the first and second drive units 134 and 135 respectively apply the voltage of the power supply Vcc to the first and second input/output lines IO and IOb through the NMOS transistors NM1 and NM11 in response to the data input control signals CNFWTSW.

Therefore, the first input/output line IO and the second input/output line IOb are respectively pulled up to a potential level of the voltage of the power supply Vcc minus the threshold voltage Vth of the NMOS transistors NM1 and NM11. As shown in FIG. 10, each of the first input/output line IO and the second input/output line IOb, when pulled up to a logic high level, has a potential level of ΔB lower than ΔA of FIG. 9. Accordingly, the data input circuit 130 can reduce current consumption, thus improving electrical characteristics of the semiconductor memory device.

Figure 11:
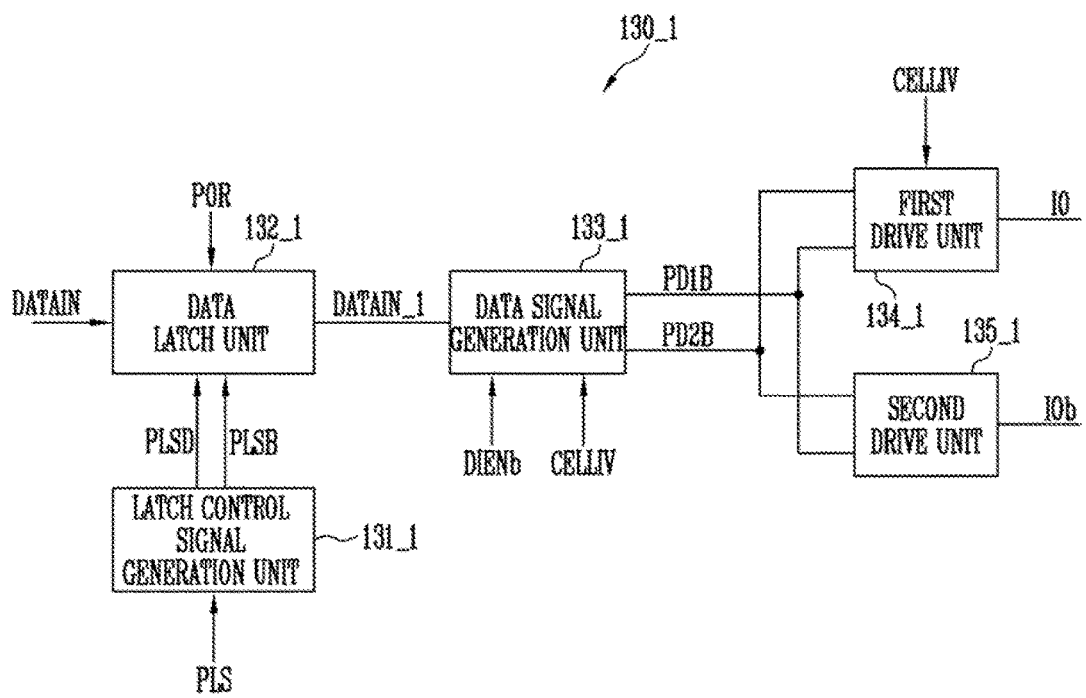
FIG. 11 is a block diagram illustrating a data input circuit of FIG. 1.

FIG. 11 is a block diagram illustrating a data input circuit 130.

Referring to FIG. 11, the data input circuit 130_1 includes a latch control signal generation unit 131_1, a data latch unit 132_1, a data signal generation unit 133_1, a first drive unit 134_1, and a second drive unit 135_1.

The latch control signal generation unit 131_1 generates first and second latch signals PLSD and PLSB in response to a clock signal PLS. The first and second latch signals PLSD and PLSB have opposite phases to each other.

The data latch unit 132_1 receives input data DATAIN in response to the first and second latch signals PLSD and PLSB and temporarily stores the input data DATAIN, and outputs the input data DATAIN as latch data DATAIN_1.

The data signal generation unit 133_1 receives the latch data DATAIN_1 and outputs first and second data signals PD1B and PD2B corresponding to the latch data DATAIN_1 in response to a data input activation signal DIENb. Furthermore, during a cell current measurement operation of the semiconductor memory device, the data signal generation unit 133_1 outputs the first and second preset data signals PD1B and PD2B in response to a test signal CELLIV.

During a data input operation, the first drive unit 134_1 pulls up or down a potential level of the first input/output line IO in response to first and second data signals PD1B and PD2B. During a cell current measurement operation of the semiconductor memory device, the first drive unit 134_1 may directly transmit input data to the first input/output line IO in response to a test signal CELLIV.

During a data input operation, the second drive unit 145_1 pulls up or down a potential level of the second input/output line IOb in response to first and second data signals PD1B and PD2B.

Figure 12:
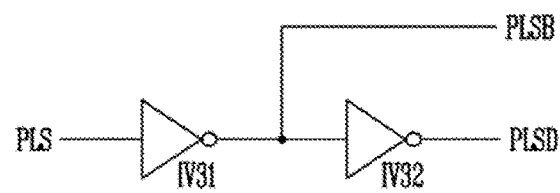
FIG. 12 is a circuit diagram illustrating a latch control signal generation unit of FIG. 11.

FIG. 12 is a circuit diagram illustrating a latch control signal generation unit 131_1 of FIG. 11.

Referring to FIG. 12, the latch control signal generation unit 131_1 includes inverters IV31 and IV32. The inverter IV31 and the inverter IV32 are connected in series to each other. The inverter IV31 inverts the clock signal PLS and outputs the inverted clock signal PLS as the second latch signal PLSB. The inverter IV32 inverts the second latch signal PLSB and outputs the inverted second latch signal PLSB as the first latch signal PLSD.

Figure 13:
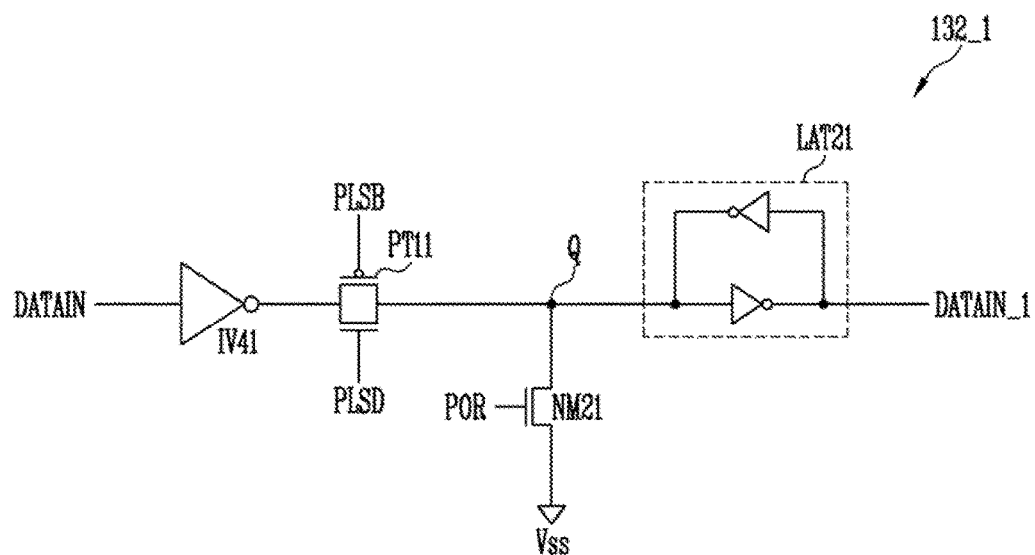
FIG. 13 is a circuit diagram illustrating a data latch unit of FIG. 11.

FIG. 13 is a circuit diagram illustrating the data latch unit 132_1 of FIG. 11.

Referring to FIG. 13, the data latch unit 132_1 includes an inverter IV31, a pass transistor PT11, a transistor NM21 and a latch LAT1.

The inverter IV31 inverts the input data DATAIN. The pass transistor PT11 transmits an output signal of the inverter IV31 to a node Q in response to the first and second latch signals PLSD and PLSB. The transistor NM21 is connected between the node Q and the ground Vss. In response to the power on reset signal POR, the transistor NM21 connects the node Q and the ground Vss to each other to initialize a potential level of the internal node Q to the voltage of the ground Vss.

The latch LAT21 is connected to the node Q. The latch LAT21 temporarily stores the inverted input data DATAIN, which is input from the node Q, and inverts the inverted input data DATAIN again, and outputs the Input data DATAIN as latch data DATAIN_1.

Figure 14:
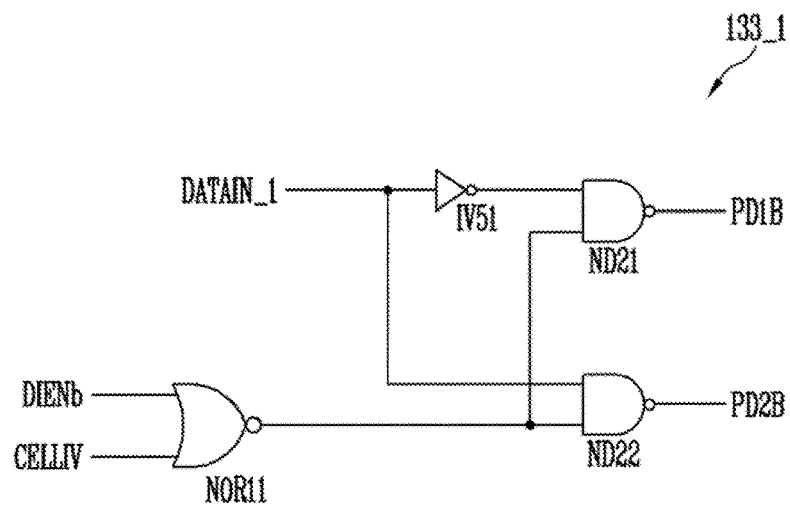
FIG. 14 is a circuit diagram illustrating a data signal generation unit of FIG. 11.

FIG. 14 is a circuit diagram illustrating the data signal generation unit 133_1 of FIG. 11.

Referring to FIG. 14, the data signal generation unit 133_1 includes an inverter IV51 and logic gates NOR11, ND21, and ND22.

The logic gate NOR11 performs a logical operation on the data input activation signal DIENb and the test signal CELLIV, and generates a logic signal. The inverter IV51 inverts the latch data DATAIN_1 output from the data latch unit 132_1. The logic gate ND21 performs a logical operation on an output signal of the inverter IV51 and an output signal of the logic gate NOR11 and generates the first data signal PD1B. The logic gate ND22 performs a logical operation on the latch data DATAIN_1 and the output signal of the logic gate NOR11 and generates the first data signal PD1B. The first data signal PD1B and the second data signal PD2B have opposite phases to each other and alternatively toggle between each other.

Figure 15:
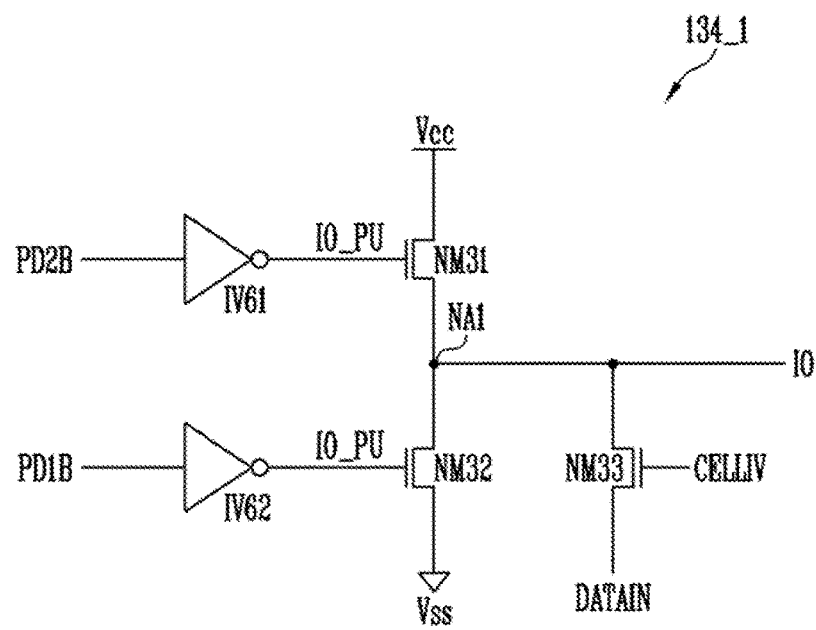
FIG. 15 is a circuit diagram illustrating a first drive unit of FIG. 11.

FIG. 15 is a circuit diagram illustrating a first drive unit 134_1 of FIG. 11.

Referring to FIG. 15, the first drive unit 134_1 includes an inverter IV61 and IV62 and NMOS transistors NM31, NM32, and NM33.

The Inverter IV61 inverts the second data signal PD2B and outputs it as a pull-up signal IO_PU. The inverter IV62 inverts the first data signal PD1B and outputs it as a pull-down signal IO_PD.

The NMOS transistor NM31 and the NMOS transistor NM32 are connected in series between the power supply Vcc and the ground Vss. In response to the pull-up signal IO_PU, the NMOS transistor NM31 performs a pull-up operation of increasing a potential level of an output node NA1 provided between the NMOS transistor NM31 and the NMOS transistor NM32. The NMOS transistor NM32 performs a pull-down operation of discharging the potential level of the output node NA1 in response to the pull-down signal IO_PD. The output node NA1 is connected to the first input/output line IO.

The NMOS transistor NM33 is connected to the first input/output line IO and transmits the input data DATAIN to the first input/output line IO in response to the test signal CELLIV.

During a pull-up operation, the NMOS transistor NM31 increases a potential level of the output node NA1 to a potential level of the voltage of the power supply Vcc minus a threshold voltage Vth of the NMOS transistor NM31. Therefore, the pull-up level of the first input/output line IO is reduced, thereby current consumption can be reduced.

As described above, the first drive unit 134_1 alternately perform pull-up and pull-down operations to the first input/output line IO in response to the first data signal PD1B and the second data signal PD2B, which have opposite phases and alternately toggle between each other.

Figure 16:
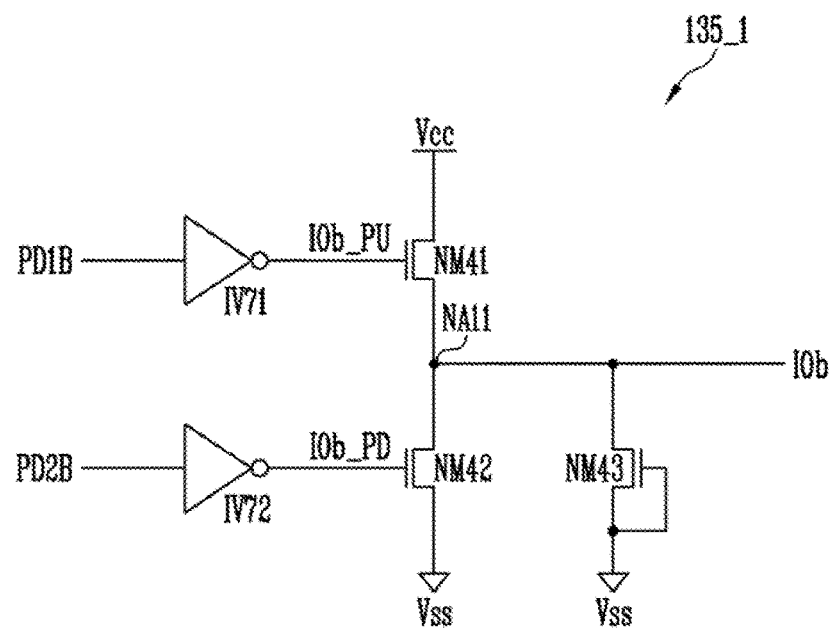
FIG. 16 is a circuit diagram illustrating a second drive unit of FIG. 11.

FIG. 16 is a circuit diagram illustrating a second drive unit 135_1 of FIG. 11.

The second drive unit 135_1 includes inverters IV71 and IV72 and NMOS transistors NM41, NM42, and NM43.

The inverter IV71 inverts the first data signal PD1B and outputs it as a pull-up signal IOb_PU. The inverter IV72 inverts the second data signal PD2B and outputs it as a pull-down signal IOb_PD.

The NMOS transistor NM41 and the NMOS transistor NM42 are connected in series between the power supply Vcc and the ground Vss. In response to the pull-up signal IOb_PU, the NMOS transistor NM41 performs a pull-up operation of increasing a potential level of an output node NA11 provided between the NMOS transistor NM41 and the NMOS transistor NM42. The NMOS transistor NM42 performs a pull-down operation of discharging the potential level of the output node NA11 in response to the pull-down signal IOb_PD. The output node NA11 is connected to the second input/output line IOb.

The NMOS transistor NM43 is connected between the second input/output line IOb and the ground Vss. A gate of the NMOS transistor NM43 is connected to the ground Vss.

During a pull-up operation, the NMOS transistor NM41 increases a potential level of the output node NA11 to a potential level of the voltage of the power supply Vcc minus a threshold voltage Vth of the NMOS transistor NM41. Therefore, the pull-up level of the second input/output line IOb is reduced, thereby current consumption can be reduced.

As described above, the second drive unit 135_1 alternately performs pull-up and pull-down operations to the second input/output line IOb in response to the first data signal PD1B and the second data signal PD2B, which have opposite phases and alternately toggle between each other.

Figure 17:
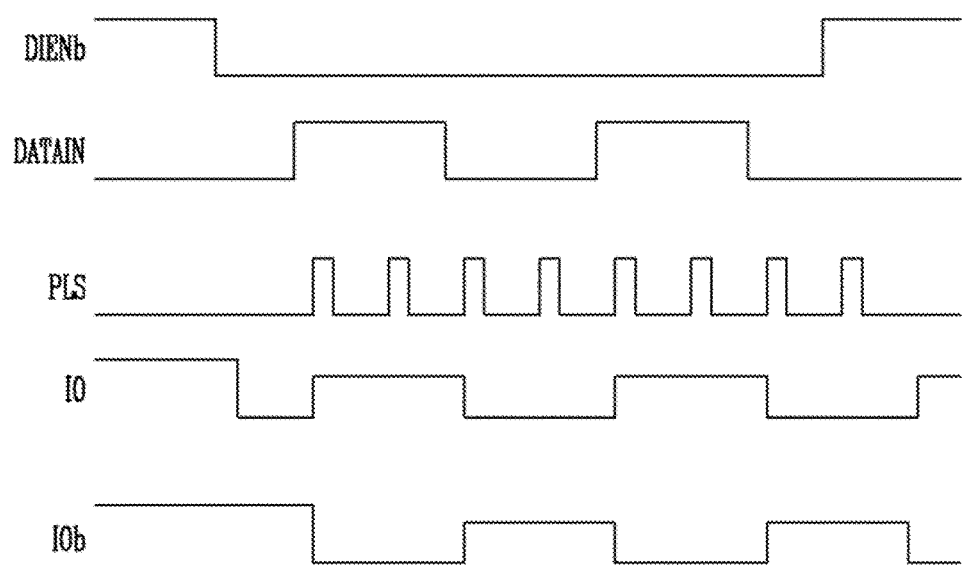
FIG. 17 is a signal waveform diagram illustrating an operation of the data input circuit according to an embodiment of the present disclosure.

FIG. 17 is a signal waveform diagram illustrating an operation of the data input circuit according to the present invention.

The operation of the data input circuit according to the present disclosure will be described below with reference to FIGS. 11 to 17.

In response to a data input activation signal DIENb, the data signal generation unit 133_1 is activated.

The latch control signal generation unit 131_1 generates the first and second latch signals PLSD and PLSB in response to the clock signal PLS having a predetermined period.

The data latch unit 132_1 temporarily stores the input data DATAIN in response to the first and second latch signals PLSD and PLSB and then outputs it as the latch data DATAIN_1.

The data signal generation unit 133_1 outputs first and second data signals PD1B and PD2B according to the latch data DATAIN_1 output from the data latch unit 132_1 in response to the data input activation signal DIENb.

The first and second drive units 134_1 and 135_1 perform data input operations in such a way as to respectively alternate pull-up and pull-down operations to the first and second input/output lines IO and IOb in response to the first and second data signals PD1B and PD2B.

During the pull-up operation to the first and second input/output lines IO and IOb, the first and second drive units 134_1 and 135_1 respectively apply the voltage of the power supply Vcc to the first and second input/output lines IO and IOb. Therefore, the first input/output line IO and the second input/output line IOb are respectively pulled up to a potential level of the voltage of the power supply Vcc minus a threshold voltage Vth of the NMOS transistors NM31 and NM41. Accordingly, the data input circuit 130_1 can reduce current consumption, thus improving electrical characteristics of the semiconductor memory device.

The data input circuit 130_1 shown in FIGS. 11 to 16 is reduced in the numbers of transistors and latches compared to the data input circuit 130 shown in FIGS. 3 to 8. Thereby, the data input circuit 130_1 can improve the degree of integration of the semiconductor memory device because the number of elements can be reduced.

Figure 18:
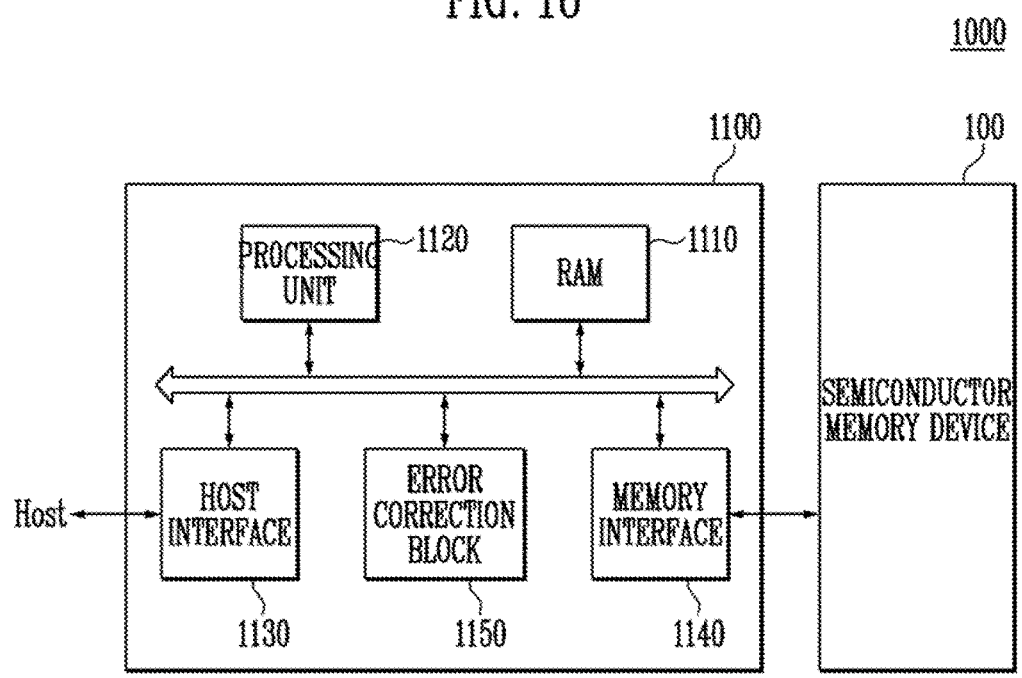
FIG. 18 is a block diagram showing a memory system including the semiconductor memory device of FIG. 1.

FIG. 18 is a block diagram showing a memory system including the semiconductor memory device of FIG. 1.

Referring FIG. 18, the memory system 1000 includes the semiconductor memory device 100 and a controller 1100.

The semiconductor memory device 100 may have the same configuration and operation as those of the semiconductor memory device described with reference to FIG. 1. Hereinafter, the repetitive explanations will be omitted.

The controller 1100 is connected to a Host and the semiconductor memory device 100. In response to a request from the Host, the controller 1100 accesses the semiconductor memory device 100. For example, the controller 1100 controls read, write, remove, and background operations of the semiconductor memory device 100. The controller 1100 provides an interface between the Host and the semiconductor memory device 100. The controller 1100 drives firmware for controlling the semiconductor memory device 100.

The controller 1100 includes a RAM (random access memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the Host, and a buffer memory between the semiconductor memory device 100 and the Host. The processing unit 1120 controls an entire operation of the controller 1100. In addition, the controller 1100 may temporarily store program data provided from the host during the write operation.

The host interface 1130 includes a protocol for performing data exchange between the Host and controller 1100. As an embodiment, the controller 1200 communicates with the Host through at least one of various interface protocols including a Universal Serial Bus (USB) protocol, a multimedia card (MMC) protocol, peripheral component interconnection (PCI) protocol, PCI-express (PCI-E) protocol, Advanced Technology Attachment (ATA) protocol, Serial-ATA protocol, Parallel-ATA protocol, small computer small interface (SCSI) protocol, enhanced small disk interface (ESDI) protocol, and Integrated Drive Electronics (IDE) protocol, private protocol, and the like.

The memory interface 1140 performs interfacing with the semiconductor memory device 100. For example, the memory interface includes a NAND interface or NOR interface.

The error correction block 1150 detects and corrects an error in data provided from the semiconductor memory device 100 by using the error correction code. The processing unit 1120 may adjust the read voltage according to an error detection result from the error correction block 1150, and control the semiconductor memory device 100 to perform re-reading. As an embodiment, the error correction block may be provided as an element of the controller 1100.

The controller 1100 and the semiconductor memory device 10 may be integrated into a single semiconductor device. As an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card including a personal computer memory card international association (PCMCIA), compact flash card (CF), smart media card (SMC), memory stick multimedia card (MMC, RS-MMC, or MMCmicro), SD card (SD, miniSD, microSD, or SDHC), universal flash storage (UFS) or the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the Host connected to the memory system 1000 may be improved.

As another example, the memory system 1000 may be provided as one of various elements of an electronic device including a computer, Ultra Mobile PC (UMPC), workstation, net-book, Personal Digital Assistants (PDA), portable computer, web tablet, wireless phone, mobile phone, smart phone, e-book, portable multimedia player (PMP), game console, navigation device, black box, digital camera, 3-dimensional television, digital audio recorder, digital audio player, digital picture recorder, digital picture player, digital video recorder, digital video player, a device capable of transmitting/receiving information in an wireless environment, one of various devices for forming a home network, one of various electronic devices for forming a computer network, one various electronic devices for forming a telematics network, RFID device, one of various elements for forming a computing system, or the like.

As an embodiment, the semiconductor memory device 100 or the memory system 1000 may be embedded in various types of packages. For example, the semiconductor memory device 100 or the memory system 1000 may be packaged to be embedded in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 19:
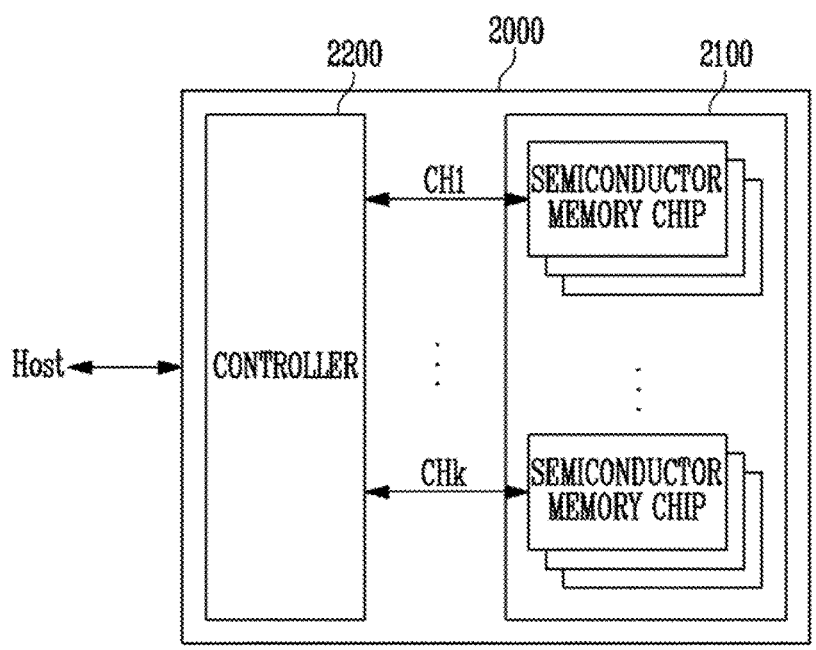
FIG. 19 is a block diagram showing an application example of the memory system of FIG. 18.

FIG. 19 is a block diagram showing an application example of the memory system of FIG. 18.

Referring FIG. 19, the memory system 2000 includes the semiconductor memory device 2100 and a controller 2200. The semiconductor memory device 2100 includes a plurality of memory chips. The semiconductor memory chips are divided into a plurality of groups.

In FIG. 19, it is illustrated that each of the plurality of groups communicates with the controller 2200 through first to k-th channels CH1 to CHk. Each semiconductor memory chip is configured to operate in the same manner as that of an embodiment of the semiconductor memory device 100 described with reference to FIG. 1.

Each group communicates with the controller 2200 through one common channel. The controller 2200 has the same configuration as that of the controller 1100 described with reference to FIG. 18 and is configured to control a plurality of memory chips of the semiconductor memory device 2100 through the plurality of channels CH1 to CHk.

Figure 20:
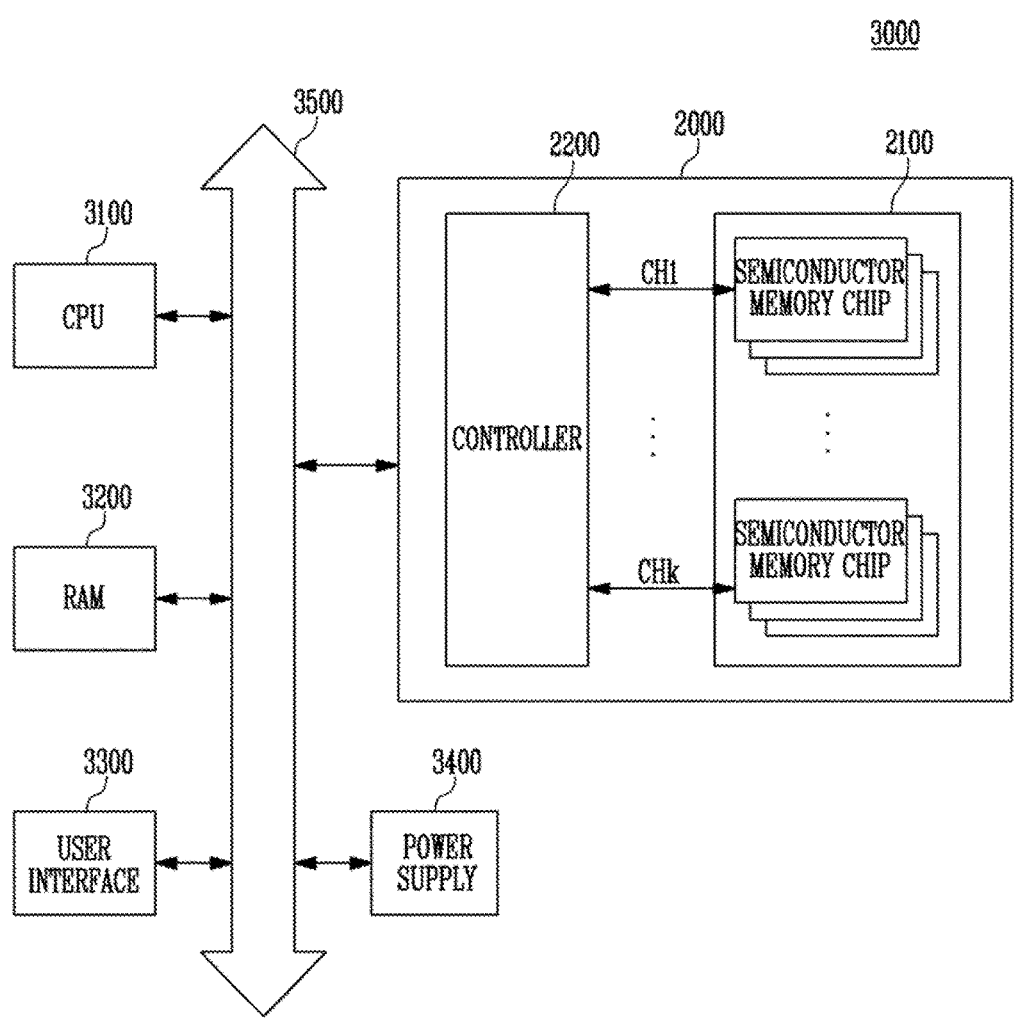
FIG. 20 is a block diagram showing a computing system including a memory system illustrated with reference to FIG. 19.

FIG. 20 is a block diagram showing a computing system including a memory system illustrated with reference to FIG. 19.

Referring to FIG. 20, the computing system 3000 includes a central processing unit 3100, a RAM 3200, a user interface 3300, a power supply 3400, a system bus 3500, and a memory system 2000.

The memory system 2000 is electrically connected to the CPU 3100, the RAM 3200, the user interface 3300, and the power supply 3400 through the system bus 3500. Data provided through the user interface 3300 or processed by the CPU 3100 is stored in the memory system 2000.

In FIG. 20, the semiconductor memory device 2100 is illustrated as being connected to the system bus 3500 through the controller 2200. However, the semiconductor memory device 2100 may be directly connected to the system bus 3500. The function of the controller 2200 may be performed by the CPU 3100 and the RAM 3200.

In FIG. 20, the memory system 2000 described with reference to FIG. 19 is illustrated as being used. However, the memory system 2000 may be replaced with the memory system 1000 described with reference to FIG. 18. As an embodiment, the computing system 3000 may include all the memory systems 1000 and 2000 described with reference to FIGS. 18 and 19. According to the present disclosure, current consumption of a data input circuit can be reduced, whereby electrical characteristics of a semiconductor memory device can be improved. Furthermore, the degree of integration of the semiconductor memory device can be improved by a reduction in the size of the data input circuit.

While the preferred embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A data input circuit, comprising:
   a data latch unit suitable for latching input data as latch data in response to first and second latch signals;
   a data signal generation unit suitable for outputting first and second data signals corresponding to the latch data;
   a first drive unit suitable for pulling up or down a first input/output data line of an input/output data line pair in response to the first and second data signals; and
   a second drive unit suitable for pulling up or down a second input/output data line of the input/output data line pair in response to the first and second data signals,
   wherein each of the first and second drive units performs a first pull-up operation or a second pull-up operation in response to a data input control signal during a pull-up operation to increase a potential level of the first or second input/output data line, and a pull-up level of the first pull-up operation is lower than a pull-up level of the second pull-up operation.

2. The data input circuit according to claim 1, wherein the first and second drive units respectively pull up the first and second input/output data lines to a voltage of a power supply or a level lower than the voltage of the power supply in response to the data input control signal.

3. The data input circuit according to claim 1, further comprising a latch control signal generation unit suitable for generating the first and second latch signals in response to a clock signal having a predetermined period.

4. The data input circuit according to claim 3, wherein the latch control signal generation unit comprises:
   a logic gate suitable for outputting the second latch signal in response to a power on reset signal and the clock signal; and
   an inverter suitable for inverting the second latch signal to the first latch signal.

5. The data input circuit according to claim 3, wherein the data latch unit comprises:

a first pass transistor suitable for transmitting the input data to an internal node in response to the first and second latch signals;

a latch suitable for latching the input data provided from the first pass transistor as the latch data; and a second pass transistor suitable for outputting the latch data of the latch in response to the first and second latch signals.

6. The data input circuit according to claim 1, wherein the data signal generation unit comprises:

a latch suitable for latching the latch data;

a first logic gate suitable for generating an output signal in response to a data input activation signal and a test signal;

a second logic gate suitable for outputting a second data signal in response to the latch data of the latch and the output signal of the first logic gate; and a third logic gate suitable for outputting a first data signal in response to an inverted signal of the latch data of the latch and the output signal of the first logic gate.

7. The data input circuit according to claim 1, wherein the first drive unit comprises:

a pull-up unit suitable for performing a pull-up operation by applying a voltage of a power supply to an output node connected to the first input/output data line in response to the second data signal;

a pull-down unit suitable for performing a pull-down operation by discharging a potential level of the output node in response to the second data signal; and a test unit suitable for directly applying the input data to the output node in response to a test signal.

8. The data input circuit according to claim 7, wherein the pull-up unit comprises an NMOS transistor and a PMOS transistor connected in parallel between the output node and the power supply, wherein the pull-up unit performs the first pull-up operation by applying a pull-up signal, which is an inverted signal of the second data signal, to the NMOS transistor in response to the data input control signal, and wherein the pull-up unit performs the second pull-up operation by applying the second data signal to the PMOS transistor in response to the data input control signal.

9. The data input circuit according to claim 8, wherein the first pull-up operation pulls up the first input/output data line to a voltage level lower than the voltage of the power supply by a threshold voltage of the NMOS transistor.

10. The data input circuit according to claim 1, wherein the second drive unit comprises:

a pull-up unit suitable for performing a pull-up operation by applying a voltage of a power supply to an output node connected to the second input/output data line in response to the first data signal; and a pull-down unit suitable for performing a pull-down operation by discharging a potential level of the output node in response to the first data signal.

11. The data input circuit according to claim 10, wherein the pull-up unit comprises an NMOS transistor and a PMOS transistor connected in parallel between the output node and the power supply, wherein the pull-up unit performs the first pull-up operation by means of applying a pull-up signal, which is an inverted signal of the first data signal, to the NMOS transistor in response to the data input control signal, and wherein the pull-up unit performs the second pull-up operation by applying the first data signal to the PMOS transistor in response to the data input control signal.

12. The data input circuit according to claim 11, wherein the first pull-up operation pulls up the second input/output data line to a voltage level lower than the voltage of the power supply by a threshold voltage of the NMOS transistor.

13. A semiconductor memory device comprising:

a memory cell array including a plurality of memory cells;

a read and write circuit connected to a plurality of bit lines of the memory cell array, and suitable for controlling potentials of the plurality of bit lines according to data to be programmed; and a data input circuit connected to the rear and write circuit and an input/output data line pair, and suitable for driving the input/output data line pair in response to input data, wherein the data input circuit performs a first pull-up operation or a second pull-up operation in response to a data input control signal during a pull-up operation to increase a potential level of the input/output data line pair, and a pull-up level of the first pull-up operation is lower than a pull-level of the second pull-up.

14. The semiconductor memory device according to claim 13, wherein the data input circuit comprises:

a data latch unit suitable for latching the input data as latch data in response to first and second latch signals;

a data signal generation unit suitable outputting first and second data signals corresponding to the latch data;

a first drive unit suitable for pulling up or down a first input/output data line of the input/output data line pair in response to the first and second data signals; and a second drive unit suitable for pulling up or down a second input/output data line of the input/output data line pair in response to the first and second data signals.

15. The semiconductor memory device according to claim 13, further comprising a voltage supply unit suitable for supplying an operation voltage to a word line of the memory cell array.

16. The semiconductor memory device according to claim 14, wherein the first drive unit comprises:

a pull-up unit suitable for performing the pull-up operation by applying a voltage of a power supply to an output node connected to the first input/output data line in response to the second data signal; and a pull-down unit suitable for performing a pull-down operation by discharging a potential level of the output node in response to the second data signal, wherein the pull-up unit comprises an NMOS transistor and a PMOS transistor connected in parallel between the output node and the power supply, wherein the pull-up unit performs the first pull-up operation by applying a pull-up signal, which is an inverted signal of the second data signal, to the NMOS transistor in response to the data input control signal, wherein the pull-up unit performs the second pull-up operation by applying the second data signal to the PMOS transistor in response to the data input control signal.

17. The semiconductor memory device according to claim 14, wherein the second drive unit comprises:

a pull-up unit suitable for performing the pull-up operation by applying a voltage of a power supply to an output node connected to the second input/output data line in response to the first data signal; and a pull-down unit suitable for performing a pull-down operation by discharging a potential level of the output node in response to the second data signal, wherein the pull-up unit comprises an NMOS transistor and a PMOS transistor connected in parallel between the output node and the power supply, wherein the pull-up unit performs the first pull-up operation by applying a pull-up signal, which is an inverted signal of the first data signal, to the NMOS transistor in response to the data input control signal, wherein the pull-up unit performs the second pull-up operation by applying the first data signal to the PMOS transistor in response to the data input control signal.

18. A data input circuit, comprising:

a data latch unit suitable for latching input data as latch data in response to first and second latch signals;

a data signal generation unit suitable for outputting first and second data signals corresponding to the latch data;

a first drive unit suitable for pulling up or down a first input/output data line of an input/output data line pair in response to the first and second data signals; and a second drive unit suitable for pulling up or down a second input/output data line of the input/output data line pair in response to the first and second data signals, wherein the first and second drive units selectively perform a first pull-up operation or a second pull-up operation of which a pull-up level is higher than a pull-up level of the first pull-up operation during a pull-up operation to increase potential levels of the first and second input/output data lines.

19. The data input circuit according to claim 18, wherein the first drive unit comprises:

a first NMOS transistor connected between a power supply and an output node connected to the first input/output data line; and a second NMOS transistor connected between a ground and the output node, wherein the first NMOS transistor applies a voltage of the power supply to the output node in response to an inverted signal of the second data signal, wherein the first NMOS transistor performs the pull-up operation to the output node by reducing the voltage of the power supply by a threshold voltage of the first NMOS transistor, and the second NMOS transistor performs a pull-down operation to the output node by discharging a potential level of the output node in response to an inverted signal of the first data signal.

20. The data input circuit according to claim 18, wherein the second drive unit comprises:

a first NMOS transistor connected between a power supply and an output node connected to the second input/output data line; and a second NMOS transistor connected between a ground and the output node, wherein the first NMOS transistor applies a voltage of the power supply to the output node in response to an inverted signal of the first data signal, wherein the first NMOS transistor performs the pull-up operation to the output node by reducing the voltage of the power supply by a threshold voltage of the first NMOS transistor, and the second NMOS transistor performs a pull-down operation to the output node by discharging a potential level of the output node in response to an inverted signal of the first data signal.

* * * * *